United States Patent
Huang

(10) Patent No.: US 6,825,505 B2
(45) Date of Patent: Nov. 30, 2004

(54) PHASE-SHIFTED DISTRIBUTED FEEDBACK TYPE SEMICONDUCTOR LASER DIODE CAPABLE OF IMPROVING WAVELENGTH CHIRPING AND EXTERNAL REFLECTION RETURN LIGHT CHARACTERISTICS

(75) Inventor: Yidong Huang, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/336,520

(22) Filed: Jan. 3, 2003

(65) Prior Publication Data

US 2003/0132451 A1 Jul. 17, 2003

(30) Foreign Application Priority Data

Jan. 7, 2002 (JP) ........................................ 2002-000295

(51) Int. Cl.$^7$ ............................................. H01L 31/072
(52) U.S. Cl. .................... 257/191; 257/76; 257/183; 257/200; 257/201; 257/437; 257/184; 438/60; 438/48; 438/72; 438/636
(58) Field of Search ..................... 257/76–78, 183–201, 257/437

(56) References Cited

U.S. PATENT DOCUMENTS 5,825,047 A * 10/1998 Ajisawa et al. ............... 257/12

FOREIGN PATENT DOCUMENTS

JP 2000-077774 3/2000
JP 2000-277851 10/2000

* cited by examiner

Primary Examiner—David Nelms
Assistant Examiner—Andy Huynh
(74) Attorney, Agent, or Firm—Katten Muchin Zavis Rosenman

(57) ABSTRACT

In a distributed feedback type semiconductor layer diode including a semiconductor substrate, an optical guide layer formed on the semiconductor substrate, a diffraction grating having a phase shift region being formed between the semiconductor substrate and the optical guide layer, and an active layer formed on the optical guide layer, $$\kappa L + A \cdot \Delta \lambda \geq B$$

where $\kappa$ is a coupling coefficient of the diffraction grating, L is a cavity length of the diode, $\Delta \lambda$ is a detuning amount denoted by $\Delta \lambda = \lambda_g - \lambda$ where $\lambda_g$ is a gain peak wavelength of the diode and $\lambda$ is an oscillation wavelength of the diode, A is a constant from 0.04 nm$^{-1}$ to 0.06 nm$^{-1}$, and B is a constant from 3.0 to 5.0.

8 Claims, 11 Drawing Sheets

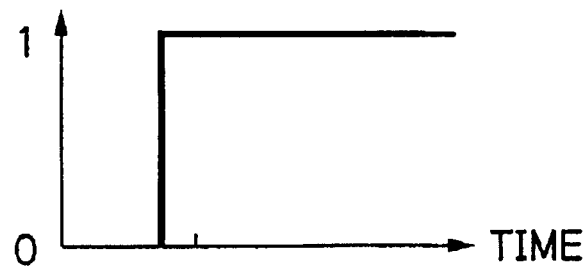
Fig. 1A  DIRECTLY MODULATED SIGNAL
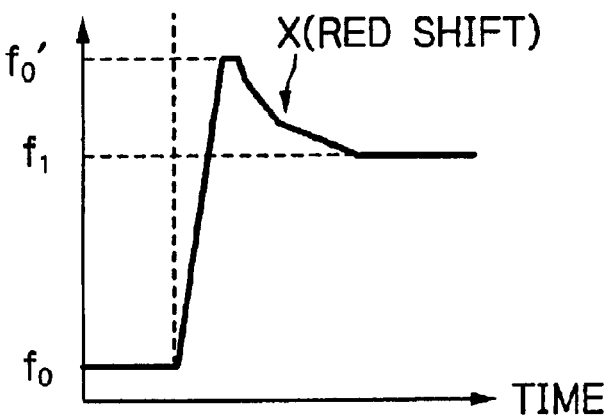
Fig. 1B  LD OSCILLATION FREQUENCY
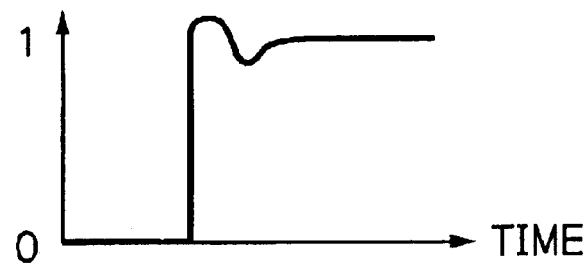
Fig. 1C  LD OUTPUT POWER (FIBER INPUT POWER)
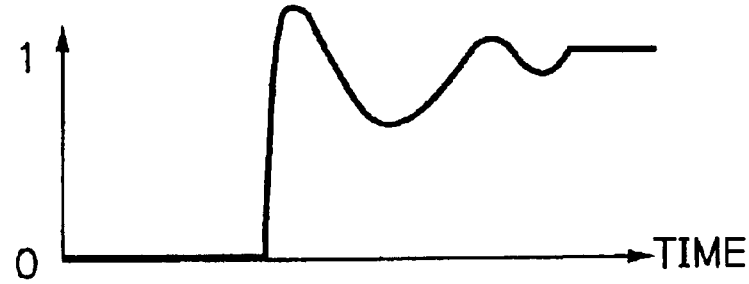
Fig. 1D  FIBER OUTPUT POWER

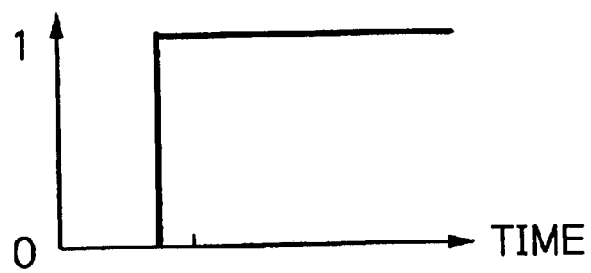
Fig. 2A DIRECTLY MODULATED SIGNAL
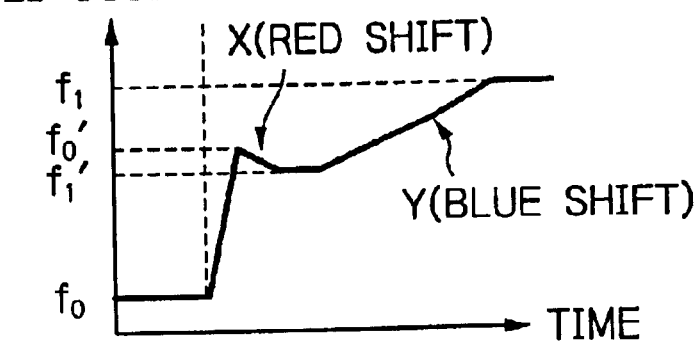
Fig. 2B LD OSCILLATION FREQUENCY
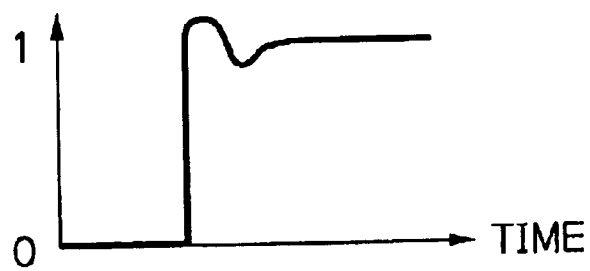
Fig. 2C LD OUTPUT POWER (FIBER INPUT POWER)
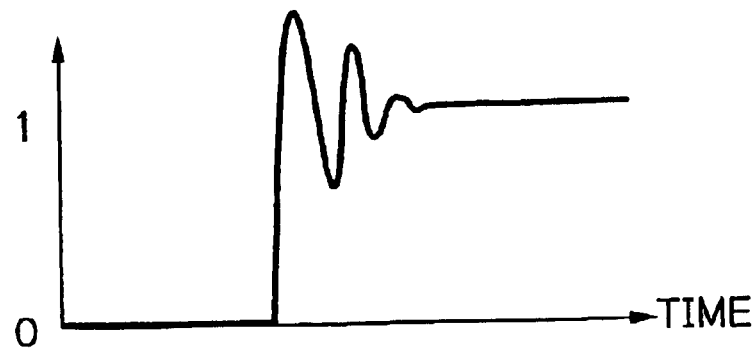
Fig. 2D FIBER OUTPUT POWER

PHASE-SHIFTED DISTRIBUTED FEEDBACK TYPE SEMICONDUCTOR LASER DIODE CAPABLE OF IMPROVING WAVELENGTH CHIRPING AND EXTERNAL REFLECTION RETURN LIGHT CHARACTERISTICS

BACKGROUND OF THE INVENTION

1. Field of the Invention

The present invention relates to a phase-shifted distributed feedback (DFB) type semiconductor laser diode (DFB-LD) and its manufacturing method.

2. Description of the Related Art

DFB-LDs have been used as light sources in high-speed, long-distance and large-capacity optical fiber communications. In directly-modulated DFB-LDs, whose output amplitude is modulated by a pump circuit, the carrier density within an active layer and the equivalent refractive index fluctuate, which induces a spectrum spread called a dynamic wavelength shift or a wavelength chirp.

In order to suppress the wavelength chirp, a prior art phase-shifted DFB-LD has been suggested (see: JP-A-2000-077774 and JP-A-2000-277851). That is, a $\lambda/n$ phase shift (n>4, preferably, n=5~8) where $\lambda$ is an oscillation wavelength is located at a diffraction grating of a waveguide.

Generally, in a DFB-LD, the fluctuation of a Bragg deviation amount $\Delta\beta$ is opposite in phase to the fluctuation of the optical output. In this case, note that a Bragg deviation amount $\Delta\beta$ is defined by $$\Delta\beta = 2n_{eq}\pi(1/\lambda - 1/\lambda_B)$$

where $n_{eq}$ is an equivalent refractive index;

$\lambda$ is an oscillation wavelength; and $\lambda_B$ is a Bragg wavelength determined by the period of the diffraction grating, i.e., twice the period of the diffraction grating.

Also, assume that the phase shift value is less than $\lambda/4$, for example, $\lambda/5 \sim \lambda/8$. In this case, the larger the Bragg deviation $\Delta\beta$, the smaller the mirror loss $\alpha_m$. Note that the Bragg deviation $\Delta\beta$ and the mirror loss $\alpha_m$ determine an oscillation mode. Further, the smaller the mirror loss $\alpha_m$, the larger the optical output. Therefore, when the optical output is increased by the external reflection return light, the Bragg deviation $\Delta\beta$ is decreased so that the mirror loss $\alpha_m$ is increased, thus decreasing the optical output. Contrary to this, when the optical output is decreased by the external reflection return light, the Bragg deviation $\Delta\beta$ is increased so that the mirror loss $\alpha_m$ is decreased, thus increasing the optical output. Therefore, a negative feedback control by the external reflection return light is performed upon the optical output, so that the fluctuation of the optical output can be suppressed, which also suppresses the wavelength chirp.

Note that JP-A-2000-277851 provides a $\lambda/5$ to $\lambda/8$ phase-shifted DFB-LD including a multiple quantum well (MQW) active layer formed by a tensile-strained well layer, thus realizing the above-mentioned negative feedback control.

In the above-described prior art phase-shifted DFB-LD, however, since the wavelength chirping characteristics and the transmission characteristics strongly depend on parameters of the DFB-LD, the wavelength chirping and transmission characteristics cannot be improved. Note that the wavelength chirping characteristics dominates the transmission characteristics.

SUMMARY OF THE INVENTION

It is an object of the present invention to provide a phase-shifted DFB-LD capable of improving the wavelength chirping and transmission characteristics.

Another object is to provide a method for manufacturing such a DFB-LD.

According to the present invention in a DFB-LD including a semiconductor substrate, an optical guide layer formed on the semiconductor substrate, a diffraction grating having a phase shift region being formed between the semiconductor substrate and the optical guide layer, and an active layer formed on the optical guide layer, $$\kappa L + A \cdot \Delta\lambda \geq B$$

where $\kappa$ is a coupling coefficient of the diffraction grating, L is a cavity length of the diode, $\Delta\lambda$ is a detuning amount denoted by $\Delta = \lambda_g - \lambda$ where $\lambda_g$ is a gain peak wavelength of the diode and $\lambda$ is an oscillation wavelength of the diode, A is a constant from 0.04 nm$^{-1}$ to 0.06 nm$^{-1}$, and B is a constant from 3.0 to 5.0.

Also, in a method for manufacturing a phase-shifted DFB-LD, a plurality of samples of the phase-shifted DFB-LD having different normalized coupling coefficients $\kappa L$ and different detuning amounts $\Delta\lambda$ are formed. Next, power penalties of the samples connected to an optical fiber are measured. Next, values of the normalized coupling coefficients $\kappa L$ and the detuning amounts $\Delta\lambda$ of the samples with the power penalties are plotted in a graph. Next, $\kappa L + A \cdot \Delta\lambda = B$ is determined where A and B are constants in order to divide the samples into first and seconds areas in the graph, so that most of the samples belonging to the first area have power penalties smaller than a definite value and most of the samples belonging to the second area have power penalties not smaller than the definite value. Finally, a new phase-shifted DFB-LD having a normalized coupling coefficient $\kappa L$ and a detuning amount $\Delta\lambda$ satisfying $\kappa L + A \cdot \Delta\lambda \geq B$ is formed.

BRIEF DESCRIPTION OF THE DRAWINGS

The present invention will be more clearly understood from the description set forth below, with reference to the accompanying drawings, wherein:

FIG. 1A is a timing diagram showing a directly modulated signal applied to a phase-shafted DFB-LD;

FIG. 1B is a timing diagram showing an oscillation frequency of the phase-shifted DFB-LD of FIG. 1A;

FIG. 1C is a timing diagram showing the optical output power of the phase-shifted DFB-LD of FIG. 1A;

FIG. 1D is a timing diagram showing an optical output power of an optical fiber receiving the optical output power of the phase-shifted DFB-LD of FIG. 1A;

FIG. 2A is a timing diagram showing a directly modulated signal applied to a phase-shafted DFB-LD;

FIG. 2B is a timing diagram showing an oscillation frequency of the phase-shifted DFB-LD of FIG. 2A;

FIG. 2C is a timing diagram showing the optical output power of the phase-shifted DFB-LD of FIG. 2A;

FIG. 2D is a timing diagram showing an optical output power of an optical fiber receiving the optical output power of the phase-shifted DFB-LD of FIG. 2A;

DESCRIPTION OF THE PREFERRED EMBODIMENTS

Figure 3:
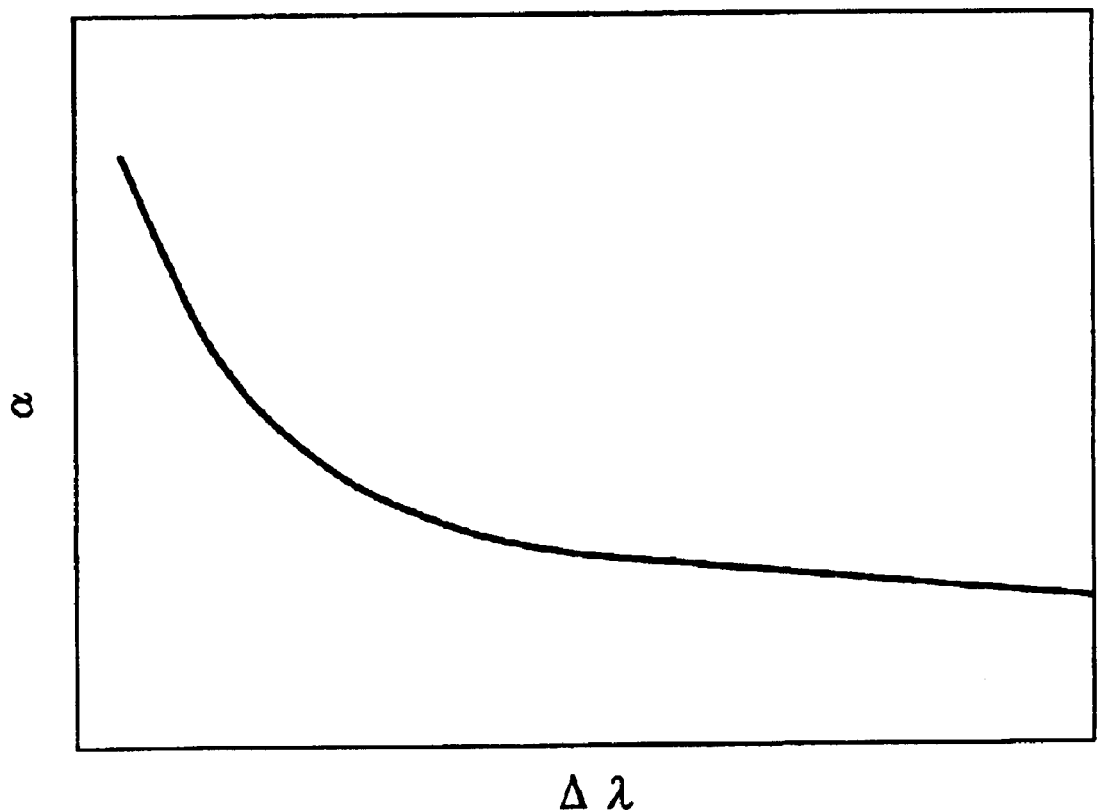
FIG. 3 is a graph showing detuning amount-to-linewidth enhancement factor characteristics of a phase-shafted DFB-LD.

First, the principle of the present invention will be explained.

In a phase-shifted DFB-LD, light reflection is distributed by a diffraction grating and a phase shift region is located at the diffraction grating. Therefore, a light intensity distribution is not uniform along the axis direction. As a result, since light is confined around the phase shift region, an electric field at the phase shift region is strong. Also, since carriers around the phase shift region are consumed by the induced emission in accordance with the strong light intensity at the phase shift region, the carrier density of the phase shift region is relatively low, so as to increase the refractive index thereof due to the plasma effect. This is called a spatial hole burning (SHB) phenomenon. Thus, when the phase-shift DFB-LD is directly modulated, the refractive index of the phase shift region fluctuates so that the phase shift amount is effectively changed.

Generally, if no consideration is given to the SHB phenomenon, when a directly modulated signal is switched from "0" to "1", the oscillation wavelength is increased as carriers are injected into the phase shift region. This is called an oscillation wavelength red shift due to the carrier injection effect. On the other hand, since the SHB phenomenon increases the effective phase shift amount, the oscillation wavelength is decreased due to the countereffect to the carrier injection effect. This is called an oscillation wave blue shift.

The relationship between a coupling coefficient $\kappa$ and the transmission characteristics will be explained next with reference to FIGS. 1A, 1B, 1C and 1D and FIGS. 2A, 2B, 2C and 2D. Note that the coupling coefficient $\kappa$ is defined by $$\kappa = \pi \cdot \Delta n / \lambda_B$$

where $\Delta n$ is the difference in refractive index depending on the period of the diffraction grating. Note that a normalized coupling coefficient $\kappa L$ where L is a cavity length may be also used instead of the coupling coefficient $\kappa$.

Assume that a phase-shifted DFB-LD has a relatively small coupling coefficient $\kappa$, i.e., a relatively small normalized coupling coefficient $\kappa L$. In this case, when a directly modulated signal as shown in FIG. 1A is applied to the phase-shifted DFB-LD, the oscillation frequency of the phase-shifted DFB-LD is increased from $f_0$ to $f_0'$, and then, is decreased as indicated by X (red shift) in FIG. 1B due to the carrier injection effect. Finally, since the SHB effect is weak so that the effective phase shift amount is small, the oscillation frequency is brought close to $f_1$. In this case, the optical output power of the phase-shifted DFB-LD exhibits a relaxation oscillation as shown in FIG. 1C. As a result, the above-mentioned red shift X decreases the group speed of a transmission pulse traveling through an optical fiber to spread a pulse waveform, so that it will takes a long time for the optical output power of the optical fiber to stabilize as shown in FIG. 1D.

Next, assume that a phase-shifted DFB-LD has a relatively large coupling coefficient $\kappa$, i.e., a relatively large normalized coupling coefficient $\kappa L$. In this case, when a directly modulated signal as shown in FIG. 2A is applied to the phase-shifted DFB-LD, the oscillation frequency of the phase-shifted DFB-LD is increased from $f_0$ to $f_0'$, and then, is decreased to $f_1'$, as indicated by X (red shift) in FIG. 2B due to the carrier injection effect. Finally, since the SHB effect is strong so that the effective phase shift amount is large, the oscillation frequency is increased to $f_1$ as indicated by Y (blue shift) in FIG. 2B. In this case, the optical output power of the phase-shifted DFB-LD also exhibits a relaxation oscillation as shown in FIG. 2C in the same way as in FIG. 1C. As a result, the above-mentioned red shift X is suppressed by the blue shift Y, which increases the group speed of a transmission pulse traveling an optical fiber to compress a pulse waveform, so that it will take a short time for the optical output power of the optical fiber to stabilize as shown in FIG. 2D.

Thus, the larger the normalized coupling effect $\kappa L$, the better the transmission characteristics.

The relationship between a detuning amount $\Delta\lambda$ and the transmission characteristics of a phase-shifted DFB-LD will be explained next with reference to FIG. 3. In FIG. 3, a detuning amount $\Delta\lambda$ is defined by $$\Delta\lambda = \lambda_g - \lambda$$

where $\lambda_g$ is a gain peak wavelength. Also, a linewidth enhancement factor $\alpha$ is defined by $$\alpha = (dn/dN)/(dG/dN)$$

where G is a gain coefficient;

N is a density of injected carriers; and n is a refractive index.

That is, the detuning amount $\Delta\lambda$ depends on the linewidth enhancement factor $\alpha$.

As stated above, when the phase-shifted DFB-LD is directly modulated, the density of injected carriers fluctuates, so that the oscillation wavelength fluctuates due to the wavelength chirp. As a result, in a long-distance transmission, when the wavelength chirp is larger, the transmission bandwidth is narrowed by the wavelength dispersion. Therefore, the better the wavelength chirping characteristics, the better the transmission characteristics. Incidentally, the wavelength chirping characteristics depends on the linewidth enhancement factor $\alpha$, which depends on the detuning amount $\Delta\lambda$ as shown in FIG. 3. Therefore, the wavelength chirping characteristics depends on the detuning amount $\Delta\lambda$.

Thus, the smaller the detuning amount $\Delta\lambda$, the better the transmission characteristics.

In summary, the larger the normalized coupling coefficient $\kappa L$ and the larger the detuning amount $\Delta\lambda$, the better the transmission characteristics. The inventor found a special relationship between the two parameters, i.e., $\kappa L$ and $\Delta \lambda$ for the better transmission characteristics.

Figure 4:
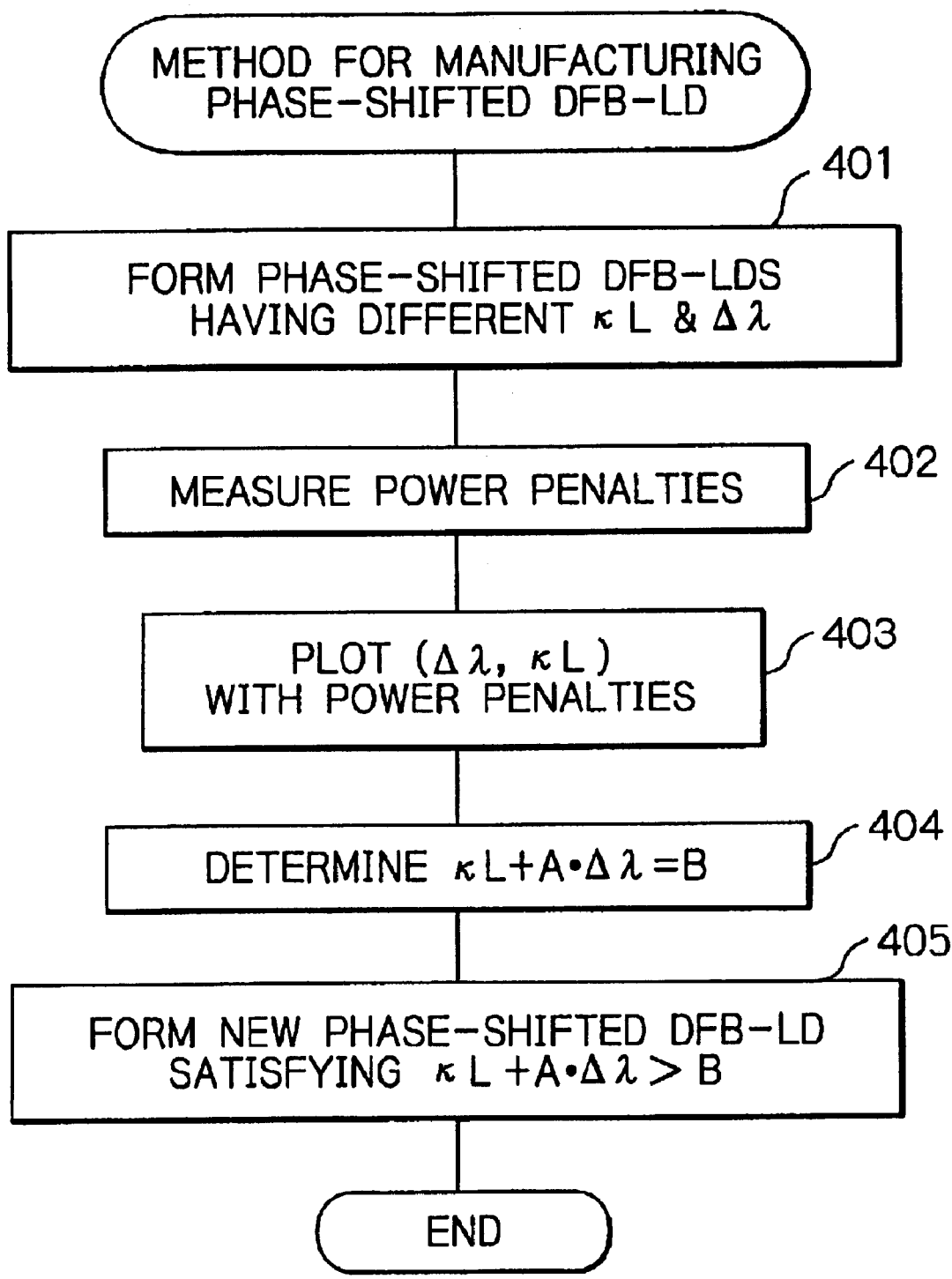
FIG. 4 is a flowchart for explaining an embodiment of the method for manufacturing a phase-shifted DFB-LD according to the present invention.

An embodiment of the method for manufacturing a phase-shifted DFB-LD according to the present invention will be explained next with reference to FIG. 4.

First, at step 401, a plurality of samples of phase-shifted DFB-LDs having different normalized coupling coefficients $\kappa L$ and different detuning amount $\Delta \lambda$ are formed.

Next, at step 402, each of the samples formed at step 401 is connected to an optical fiber having a definite length for 100-km transmission, for example. Then, the power penalty of each of the samples is measured.

Figure 5A:
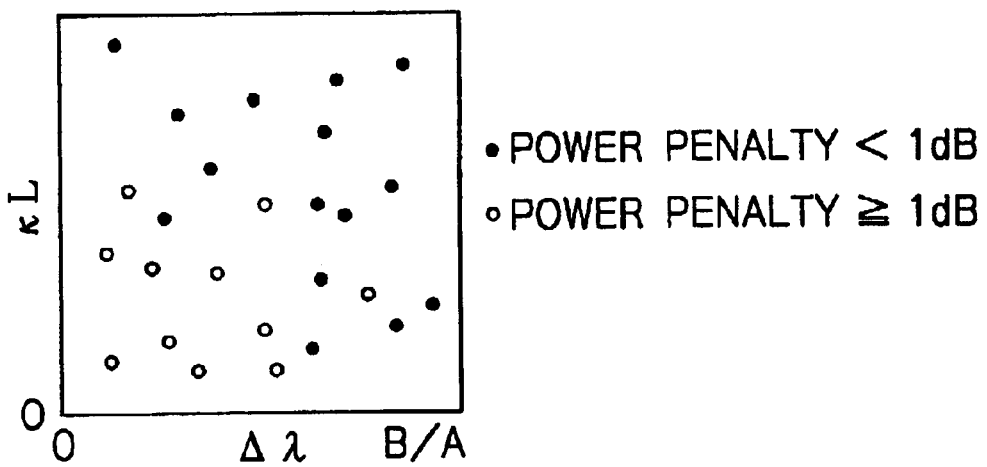
FIG. 5A is a graph showing the $\Delta\lambda$ to $\kappa L$ characteristics of the samples with their power penalties at step 403 of FIG. 4.

Next, at step 403, the values of ($\Delta \lambda$, $\kappa L$) of the samples are plotted in accordance with their power penalties as shown in FIG. 5A. In FIG. 5A, ● indicates a sample having a power penalty smaller than a definite value such as 1 dB and ○ indicates a sample having a power penalty not smaller than the definite value 1 dB. That is, the sample indicated by ● has good transmission characteristics and the sample indicated by ○ has bad transmission characteristics.

Figure 5B:
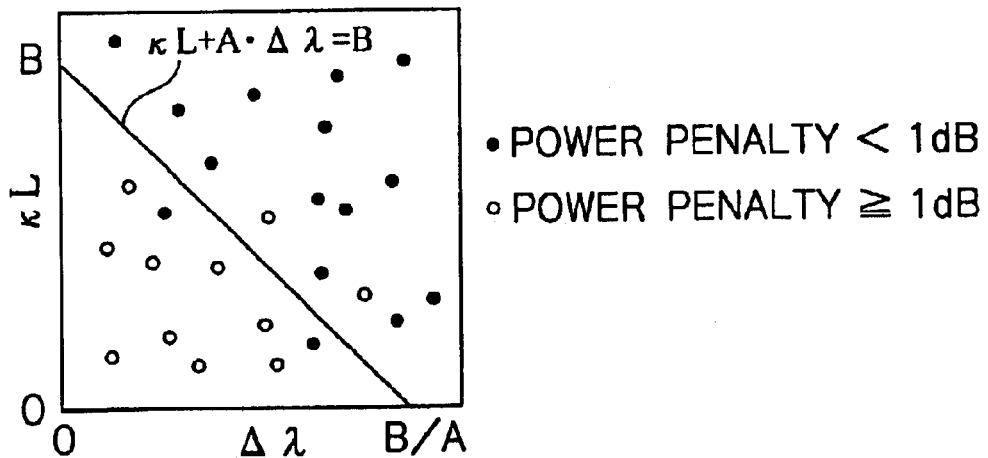
FIG. 5B is a graph showing the straight line $\kappa L + A \cdot \Delta\lambda = B$ at step 404 of FIG. 4.

Next, at step 404, a straight line $\kappa L + A \cdot \Delta \lambda = B$ as shown in FIG. 5B dividing an area formed by the samples indicated by ● and an area formed by the samples indicated by ○ is determined.

Figure 5C:
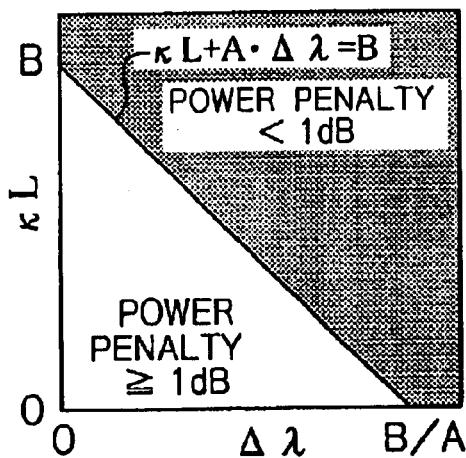
FIG. 5C is a graph showing the $\Delta\lambda$ to $\kappa L$ characteristics of the new DFB-LD at step 405 of FIG. 4.

Finally, at step 405, a new phase-shifted DFB-LD satisfying the condition $\kappa L + A \cdot \Delta \lambda \geq B$ is formed. That is, the new phase-shifted DFB-LD has a value ($\Delta \lambda$, $\kappa L$) fell in a shaded area in FIG. 5C.

Thus, if the new phase-shifted DFB-LD just satisfies the condition $\kappa L + A \cdot \Delta \lambda \geq B$, the new phase-shifted DFB-LD exhibits good transmission characteristics.

Examples of values A and B of $\kappa L + A \cdot \Delta \lambda = B$ will be explained next.

Figure 6:
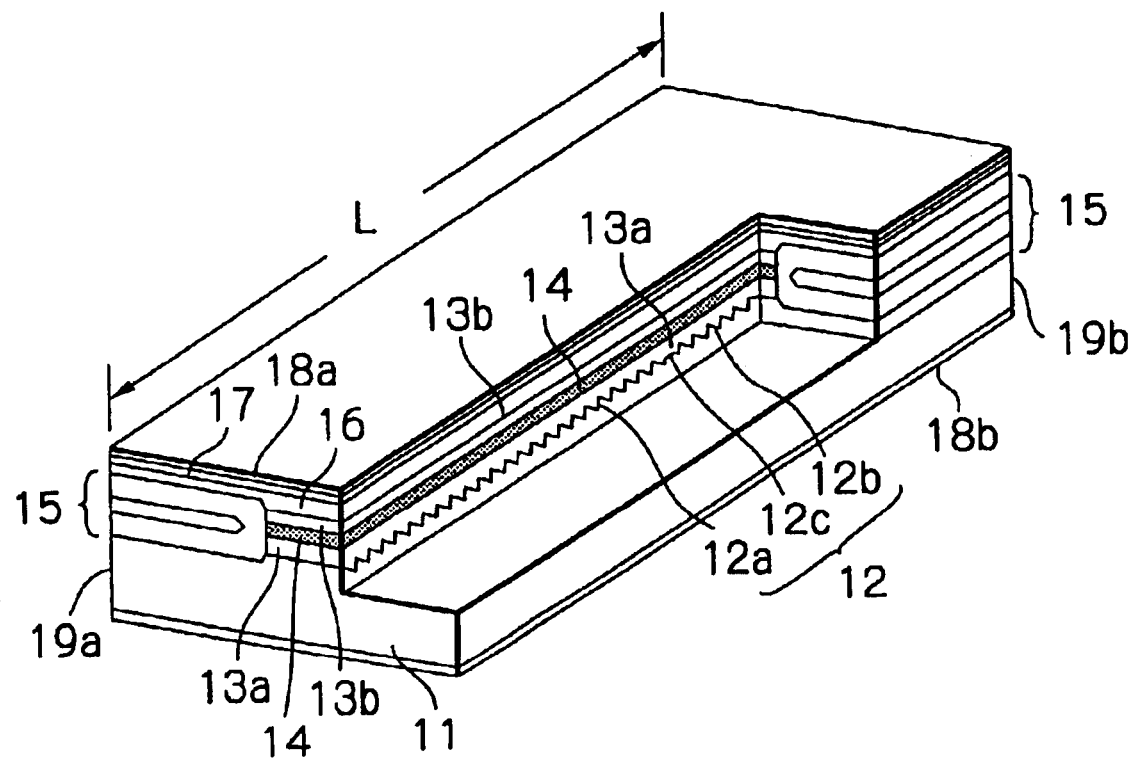
FIG. 6 is a partly-cut perspective view illustrating a first example of phase-shifter DFB-LD to which the method of FIG. 4 is applied.

A first example is applied to a phase-shifted DFB-LD as illustrated in FIG. 6.

In FIG. 6, a diffraction grating 12 is formed on an n-type InP substrate 11 by an electron beam exposure and lithography process. In this case, the diffraction grating 12 includes regions 12a and 12b having the same period corresponding to a wavelength of $\lambda$ and a $\lambda/n$ (4<n<16) phase shift flat region 12c having no diffraction grating structure therebetween. Also, formed on the diffraction grating 12 are an about 0.1 $\mu$m thick InGaAsP optical guide layer 13a, a 0.7% more compression-strained InGaAsP MQW active layer 14 including seven periods of 6 nm thick well layers and six periods of 10 nm thick barrier layers, and an about 0.05 $\mu$m thick InGaAsP optical guide layer 14 by a metalorganic vapor phase epitaxial (MOVPE) process or the like. The InGaAsP optical guide layer 13a, the InGaAsP MQW active layer 14 and the InGaAsP optical guide layer 13b are mesa-etched to form a stripe structure which is sandwiched by an InP current block layer 15. Also, an about 3 $\mu$m thick p-type InP clad layer 16 and an about 0.2 $\mu$m thick GaInAsP cap layer 17 are formed thereon. Further, a p-type electrode 18a and an n-type electrode 18b for injecting a current into the MQW active layer 14 are formed on the InGaAsP cap layer 17 and the InP substrate 11, respectively, by a sputtering process. Finally, the device is cleaved to a waveguide length L, and anti-reflection (AR) coating layers 19a and 19b having a reflectivity of about 0.1% are applied to the front side facet and the back side facet, respectively.

Figure 7:
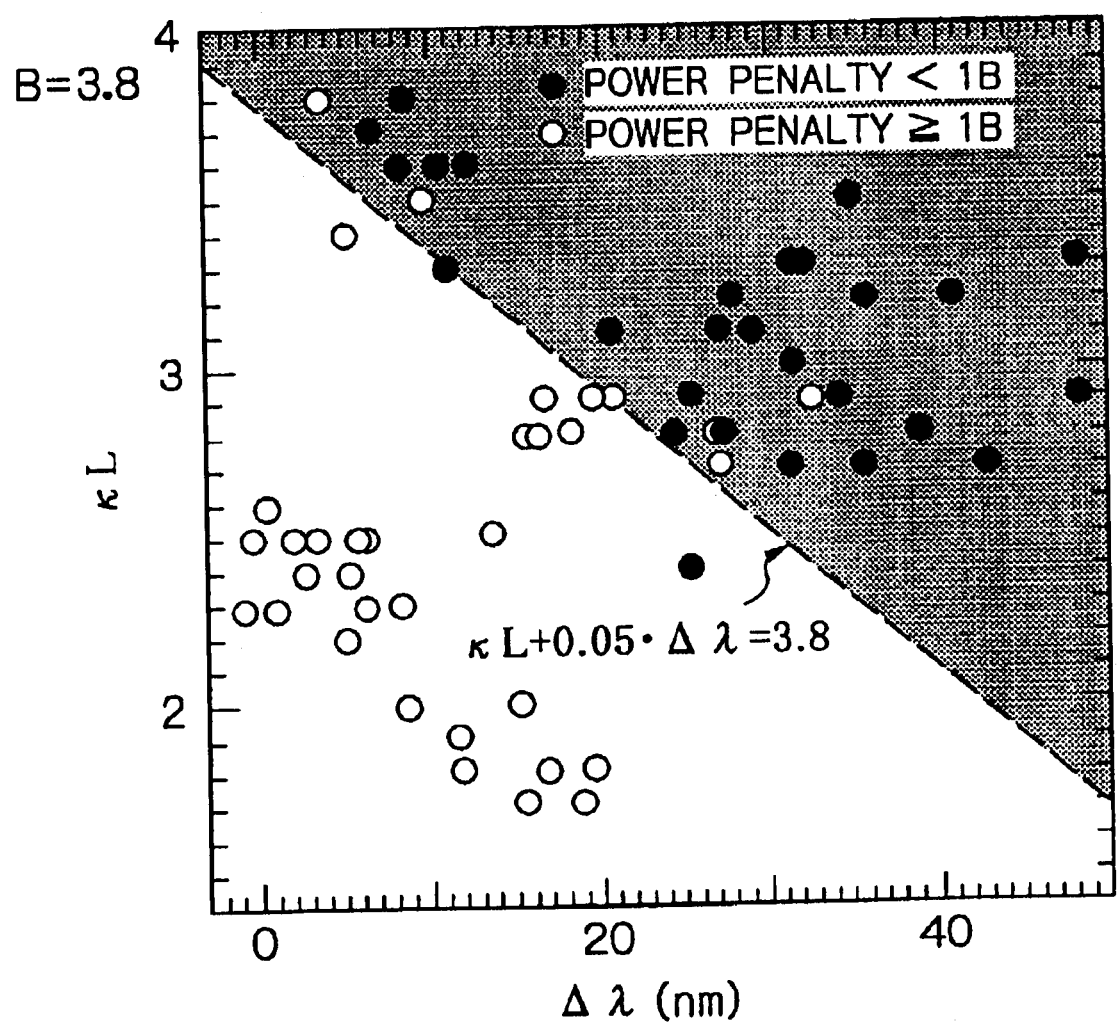
FIG. 7 is a graph showing the $\Delta\lambda$ to $\kappa L$ characteristics of the samples of the first example of FIG. 6.

In one sample of the phase-shifted DFB-LD of FIG. 6, if the etching depth of the diffraction grating 12 is 0.013 $\mu$m, the coupling coefficient $\kappa$ is about 65 cm$^{-1}$. In this case, if the cavity length L is 450 $\mu$m, the normalized coupling coefficient $\kappa L$ is 2.92. On the other hand, the gain peak wavelength $\lambda_g$ of the MQW active layer 14 is made 1.58 $\mu$m, for example. In this case, if the period of the diffraction grating 12 is 240.0 nm, the oscillation wavelength $\lambda$ is 1.55. Thus, the detuning amount $\Delta \lambda$ is 0.03 $\mu$m. In this state where ($\Delta \lambda$, $\kappa L$)=(0.03 $\mu$m, 2.92), when this sample was directly-modulated at 2.5 Gb/s and was subject to a 100 km transmission, the power penalty thereof was smaller than 1 dB. Other samples each having a value of $\kappa L$ from 1.8 to 3.0 and a value of $\Delta \lambda$ from 5 to 50 nm was directly-modulated at 2.5 Gb/s and was subject to a 100 km transmission, the power penalties are shown in FIG. 7. As a result, A=0.05 nm$^{-1}$ and B=3.0.

Figure 8:
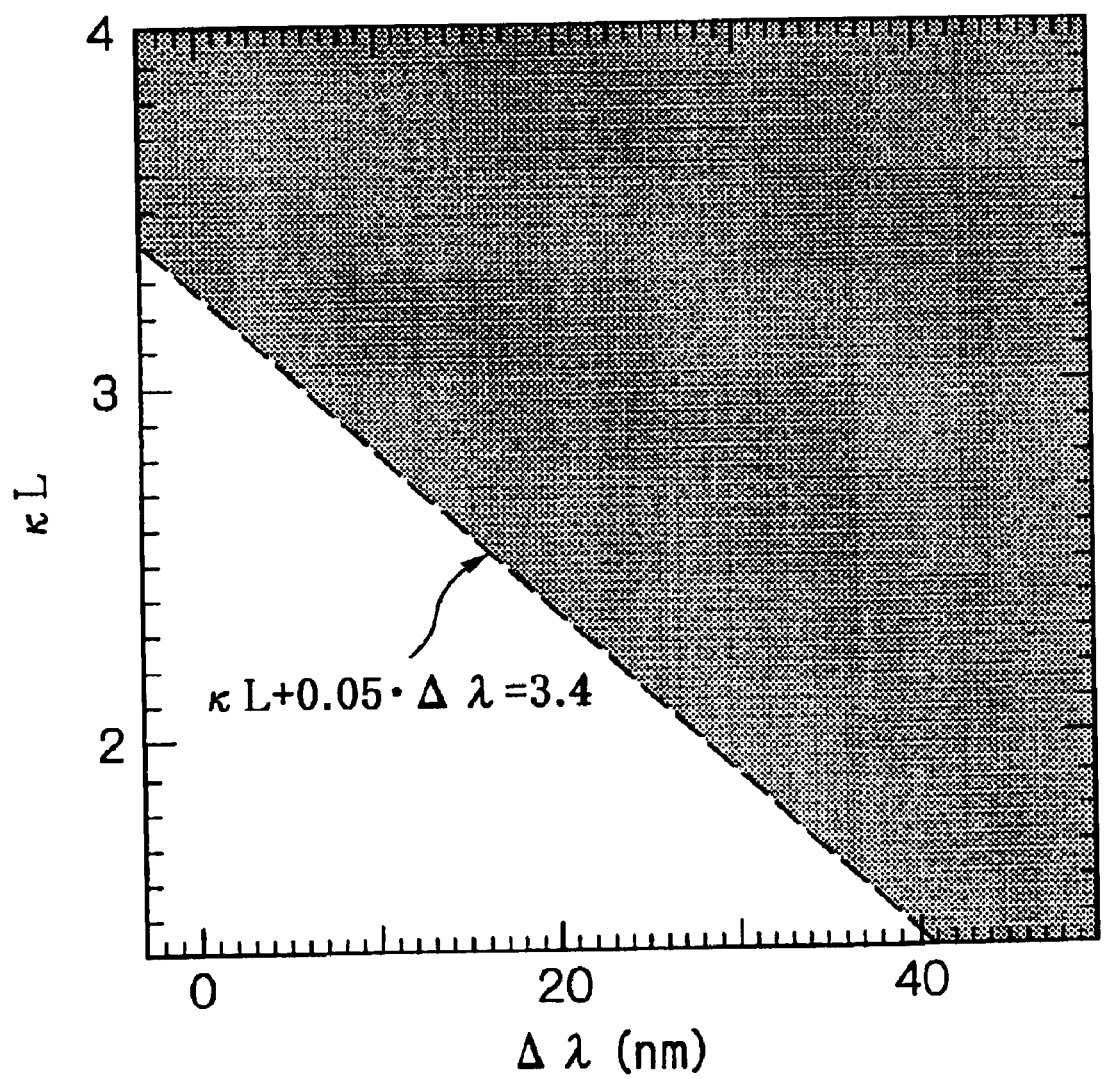
FIG. 8 is a graph showing the $\Delta\lambda$ to $\kappa L$ characteristics of samples of a second example of phase-shifted DFB-LD to which the method of FIG. 4 is applied.

A second example is applied to a phase-shifted DFB-LD which is the same as the first example of phase-shifted DFB-LD except that the InGaAsP MQW active layer 14 is modified to have a tensile strain of 7% or more. In this case, as shown in FIG. 8, A=0.05 nm$^{-1}$ and B=3.4.

Figure 9:
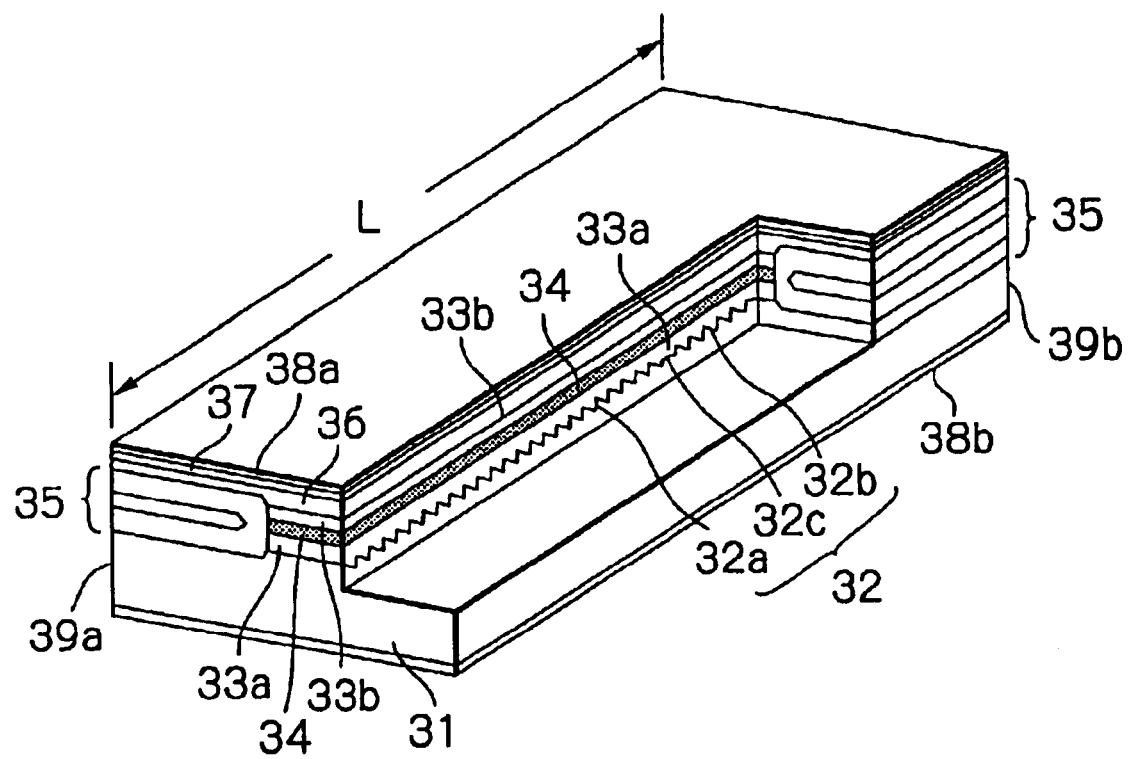
FIG. 9 is a partly-cut perspective view illustrating a third example of phase-shifter DFB-LD to which the method of FIG. 4 is applied.

A third example is applied to a phase-shifted DFB-LD as illustrated in FIG. 9.

In FIG. 9, a diffraction grating 32 is formed on an n-type InP substrate 31 by an electron beam exposure and lithography process. In this case, the diffraction grating 32 includes regions 32a and 32b having the same period corresponding to a wavelength of $\lambda$ and a $\lambda/n$ (4<n<16) phase shift flat region 32c therebetween. Also, formed on the diffraction grating 32 are an about 0.1 $\mu$m thick AlGaInAs optical guide layer 33a, an 1.0% or more compression-strained AlGaInAs MQW active layer 34 including seven periods of 6 nm thick well layers and six periods of 10 nm thick barrier layers, and an about 0.05 $\mu$m thick AlGaInAs optical guide layer 24 by an MOVPE process or the like. The AlGaInAs optical guide layer 23a, the AlGaInAs MQW active layer 24 and the AlGaInAs optical guide layer 23b are mesa-etched to form a stripe structure which is sandwiched by an InP current block layer 35. Also, an about 3 $\mu$m thick p-type InP clad layer 36 and an about 0.2 $\mu$m thick GaInAsP cap layer 37 are formed thereon. Further, a p-type electrode 38a and an n-type electrode 38b for injecting a current into the MQW active layer 34 are formed on the InGaAsP cap layer 37 and the InP substrate 31, respectively, by a sputtering process. Finally, the device is cleaved to a waveguide length L, and AR coating layers 39a and 39b having a reflectivity of about 0.1% are applied to the front side facet and the back side facet, respectively.

Figure 10:
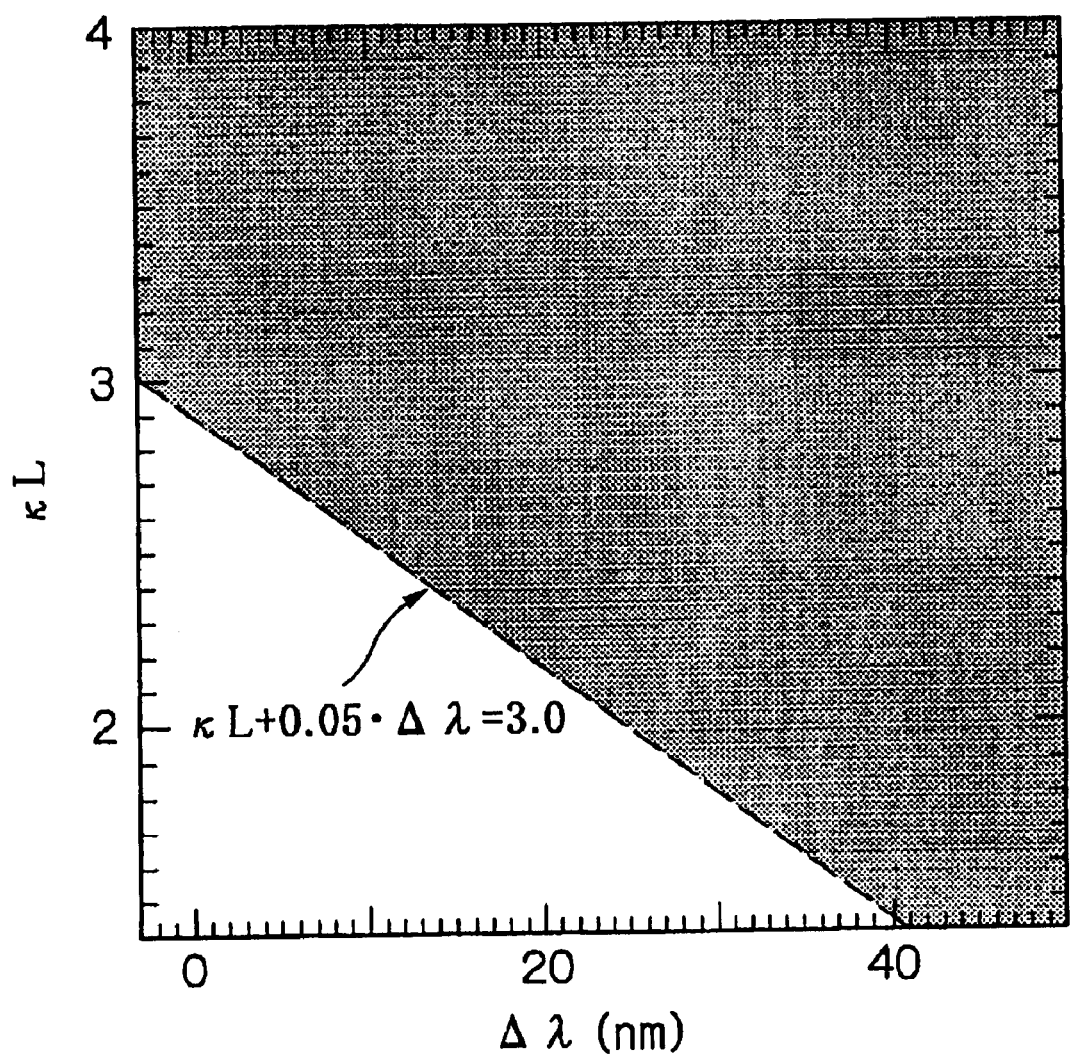
FIG. 10 is a graph showing the $\Delta\lambda$ to $\kappa L$ characteristics of the samples of the third example of FIG. 9.

In one sample of the phase-shifted DFB-LD of FIG. 9, if the etching depth of the diffraction grating 32 is 0.025 $\mu$m, the coupling coefficient $\kappa$ is about 55 cm$^{-1}$. In this case, if the cavity length L is 450 $\mu$m, the normalized coupling coefficient $\kappa L$ is 2.47. On the other hand, the gain peak wavelength $\lambda_g$ of the MQW active layer 34 is made 1.57 $\mu$m, for example. In this case, if the period of the diffraction grating 32 is 240.0 nm, the oscillation wavelength $\lambda$ is 1.55. Thus, the detuning amount $\Delta \lambda$ is 0.02 $\mu$m. In this state where ($\Delta \lambda$, $\kappa L$)=(0.02 $\mu$m, 2.47), when this sample was directly-modulated at 2.5 Gb/s and was subject to a 100 km transmission, the power penalty thereof was smaller than 1 dB. Other samples each having a value of $\kappa L$ from 1.8 to 3.0 and a value of $\Delta \lambda$ from 5 to 50 nm was directly-modulated at 2.5 Gb/s and was subject to a 100 km transmission, the power penalties were measured. As a result, as shown in FIG. 10, A =0.05 nm$^{-1}$ and B=3.0.

Figure 11:
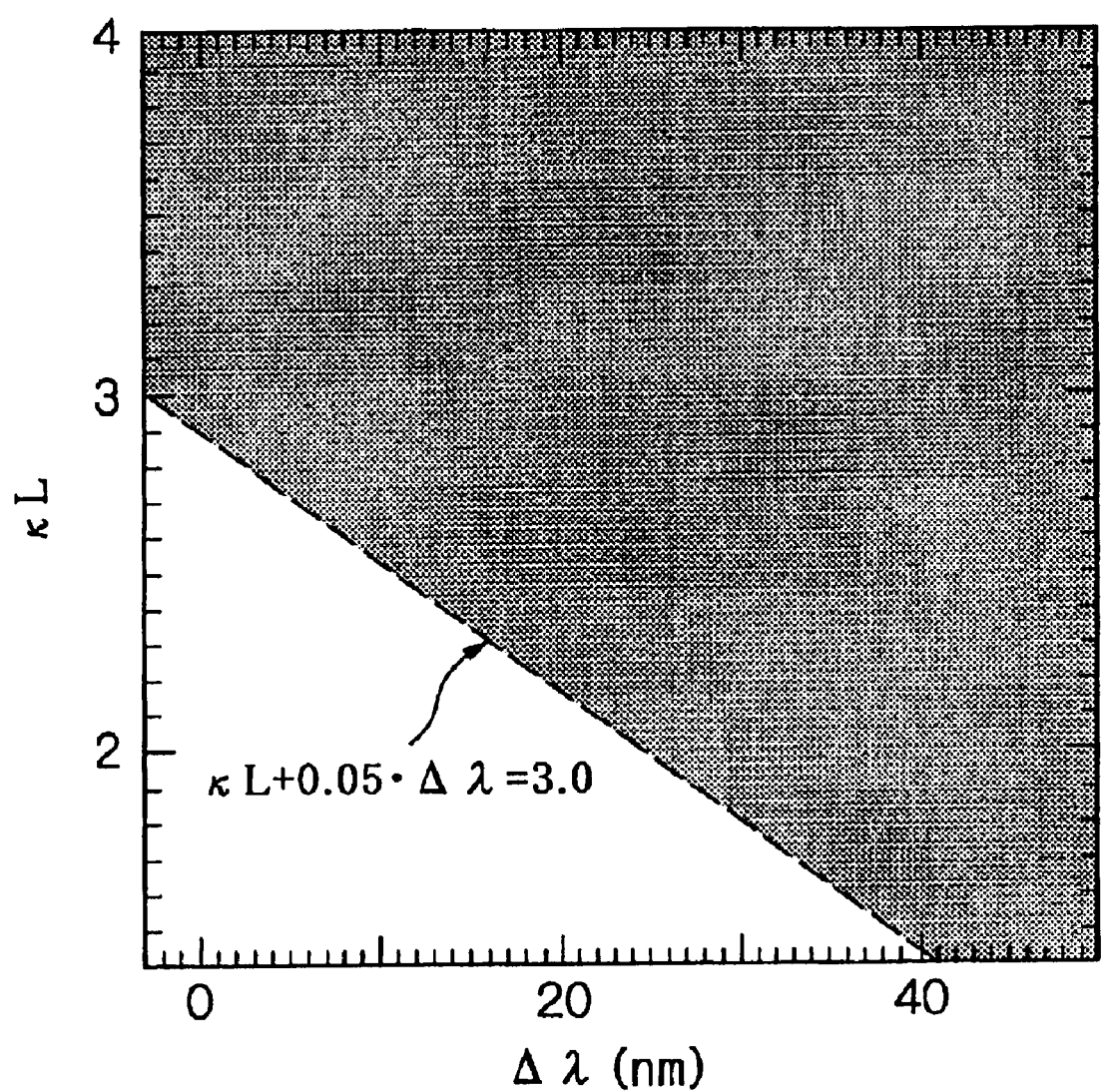
FIG. 11 is a graph showing the $\Delta\lambda$ to $\kappa L$ characteristics of samples of a fourth example of phase-shifted DFB-LD to which the method of FIG. 4 is applied.

A fourth example is applied to a phase-shifted DFB-LD which is the same as the third example of phase-shifted DFB-LD except that the InGaAsP MQW active layer 34 is modified to have a tensile strain of 1.0% or more. In this case, as shown in FIG. 11, A=0.05 nm$^{-1}$ and B=3.0.

In the above-described examples, since an active layer is constructed by a compression- or tensile-strained MQW structure, A=0.05 and B=3.4~3.8. However, the present invention can be applied to other active layers constructed by bulks, quantum small lines or quantum dots. Therefore, if some allowance is given to the values of A and B, A is preferably 0.04 to 0.06 nm$^{-1}$ and B is preferable 3.0 to 5.0.

As explained hereinabove, according to the present invention, since two parameters, i.e., a normalized coupling coefficient $\kappa L$ and a detuning amount $\Delta\lambda$ are defined to satisfy that $\kappa L+A\cdot\Delta\lambda\geq B$ where 0.04 nm$^{-1}\leq A \leq 0.06$ nm$^{-1}$ and $3.0 \leq B \leq 5.0$, the wavelength chirping and transmission characteristics can be surely improved.

What is claimed is:

1. A distributed feedback type semiconductor layer diode comprising:

a semiconductor substrate;

an optical guide layer formed on said semiconductor substrate, a diffraction grating having a phase shift region being formed between said semiconductor substrate and said optical guide layer; and an active layer formed on the optical guide layer, wherein $$\kappa L+A\cdot\Delta\lambda \geq B$$

where $\kappa$ is a coupling coefficient of said diffraction grating,

L is a cavity length of said diode, $\Delta\lambda$ is a detuning amount denoted by $\Delta\lambda=\lambda_g-\lambda$ where $\lambda_g$ is a gain peak wavelength of said diode and $\lambda$ is an oscillation wavelength of said diode, A is a constant from 0.04 nm$^{-1}$ to 0.06 nm$^{-1}$, and B is a constant from 3.0 to 5.0.

2. The distributed feedback type semiconductor laser diode as set forth in claim 1, wherein said phase shift region has a phase shift amount of to $\lambda/4$ to $\lambda/16$.

3. The distributed feedback type semiconductor laser diode as set forth in claim 1, wherein said phase shift region has no diffraction grating structure.

4. The distributed feedback type semiconductor laser diode as set forth in claim 1, wherein said active layer comprises a multiple quantum well structure.

5. The distributed feedback type semiconductor laser diode as set forth in claim 4, wherein said multiple quantum well structure is compression-strained.

6. The distributed feedback type semiconductor laser diode as set forth in claim 4, wherein said multiple quantum well structure is tensile-strained.

7. A distributed feedback type semiconductor layer diode comprising:

a semiconductor substrate;

an InGaAsP optical guide layer formed on said semiconductor substrate, a diffraction grating having a phase shift region being formed between said semiconductor substrate and said InGaAsP optical guide layer; and a 0.7% or more compression-strained InGaAsP multiple quantum well active layer formed on said InGaAsP optical guide layer, wherein $$\kappa L+0.05\cdot\Delta\lambda \geq 3.8$$

where $\kappa$ is a coupling coefficient of said diffraction grating,

L is a cavity length of said diode, and $\Delta\lambda$ is a detuning amount denoted by $\Delta\lambda=\lambda_g-\lambda$ where $\lambda_g$ is a gain peak wavelength of said diode and $\lambda$ is an oscillation wavelength of said diode.

8. A distributed feedback type semiconductor layer diode comprising:

a semiconductor substrate;

an InGaAsP optical guide layer formed on said semiconductor substrate, a diffraction grating having a phase shift region being formed between said semiconductor substrate and said InGaAsP optical guide layer; and a 0.7% or more tensile-strained InGaAsP multiple quantum well active layer formed on said InGaAsP optical guide layer, wherein $$\kappa L+0.05\cdot\Delta\lambda \geq 3.4$$

where $\kappa$ is a coupling coefficient of said diffraction grating,

L is a cavity length of said diode, and $\Delta\lambda$ is a detuning amount denoted by $\Delta\lambda=\lambda_g-\lambda$ where $\lambda_g$ is a gain peak wavelength of said diode and $\lambda$ is an oscillation wavelength of said diode.

* * * * *